United States Patent [19]

Kanevsky

[11] Patent Number: 6,018,548
[45] Date of Patent: Jan. 25, 2000

[54] SYSTEM AND METHOD FOR COMPRESSING DATA IN A COMMUNICATION CHANNEL UTILIZING TIME ENCODING

[75] Inventor: Dimitri Kanevsky, Ossining, N.Y.

[73] Assignee: International Business Machines Corporation, Armonk, N.Y.

[21] Appl. No.: 08/978,951

[22] Filed: Nov. 26, 1997

[51] Int. Cl.$^7$ ...................................................... H04B 1/66
[52] U.S. Cl. ............................................ 375/241; 370/468
[58] Field of Search ..................................... 375/241, 240, 375/260; 370/468, 521

[56] References Cited

U.S. PATENT DOCUMENTS

| | | | |
|---|---|---|---|
| 4,972,439 | 11/1990 | Kuznicki et al. | 375/296 |
| 5,051,991 | 9/1991 | Szczutkowski | 370/521 |
| 5,381,181 | 1/1995 | Deiss | 348/423 |
| 5,533,021 | 7/1996 | Branstad et al. | 370/396 |

*Primary Examiner*—Temesghen Ghebretinsae
*Attorney, Agent, or Firm*—F. Chau & Associates, LLP

[57] ABSTRACT

A system and methods for providing data compression of data blocks utilizing time characteristics to increase the transmission time of such data over a communication channel. The underlying principle of data compression using time encoding is that data can be encoded in such a manner that, upon receiving the encoded data at the receiving end of a communication channel, the data content can be retrieved by decoding (decompressing) the compressed data in accordance with the time delays in which data arrives at the receiving end. The present invention employs a method of time encoding for data compression wherein a series of data blocks (e.g., a string of binary data) which are comprised of data units (e.g., bytes or bits) are encoded in such a manner that the following information can be retrieved (i.e., decompressed or decoded) at the receiving end of the communication channel: (1) the content of each data unit can be read (e.g. a string of one byte that represents a character or two bytes which represents a short integer); (2) the time at which each data unit arrives can be measured (e.g., n-th unit arrives at n-th times $\frac{1}{100}$ second intervals); and (3) the time interval between each unit at the receiving end can be measured (e.g., the interval between consequent bytes is $\frac{1}{10000}$ second). By encoding such time characteristics in the data units of the data blocks, a substantial amount of information may be assigned to each data block, thereby providing data compression and a decrease in the transmission time of such data.

14 Claims, 6 Drawing Sheets

SYSTEM AND METHOD FOR COMPRESSING DATA IN A COMMUNICATION CHANNEL UTILIZING TIME ENCODING

BACKGROUND OF THE INVENTION

The present invention generally relates to a system and method for compressing data in a communication channel and, more particularly, to a system and method of compressing data in a communication channel utilizing time coding whereby blocks of data can be encoded according to the time of arrival of such data blocks at a receiving end of the communication channel and/or the time interval between the received data blocks.

Data compression on a communication channel is a process of finding the most efficient representation of an information source in order to minimize communication time on such channel. In the field of communications, the amount of data which can be transmitted through a given communication channel (i.e., the quantity of informational units which can be transmitted per a unit time) is limited by the capacity of such channel to transmit information. See, generally, Shannon, C. E., 1948, "A Mathematical Theory of Communication," Bell System Technical Journal, vol 27, pp. 379–423 and 623–656. In order to transmit more data through a particular channel, various data compression techniques are employed to transmit compressed strings of data which, upon reception, can be constructed into their original form. Consequently, the more data is compressed, the greater the quantity of data that can be transmitted over a communication channel per unit time.

Conventional methods of compressing of data in a communication channel present challenging problems. For example, in many applications, the data arrives at the input of a communication channel in an uncompressed format and must be compressed dynamically in real time before such data is transmitted through the communication channel. Further, the transmitted data must be dynamically decompressed on the receiving end of the transmission channel. Such dynamic compression/decompression of data can be extremely time consuming, which essentially offsets the advantage of shorter transmission time which is obtained by data compression in a communication channel.

For example, one of most well-known conventional text data compression techniques used for computer storage, as well as telecommunications, is the Huffman Coding technique. The underlying principle of Huffman Coding data compression technique is that frequently used characters can be coded by shorter data bit strings than infrequently used characters. This method requires the processing of large quantities data to produce statistical distributions of symbols before data compression can be performed. The estimation of statistical characteristics of the data is a time consuming process, especially when the data is not homogeneous (i.e., different blocks of data have different statistical characteristics which requires further estimation of the statistical characteristics for such new data).

Similar problems exist with other conventional data compression techniques such as the Ziv-Lempbel Coding technique and Arithmetic Coding. Such techniques compress input data that is related to a model that is constructed from data that was previously encoded. A detailed description of the above data compression techniques of Huffman Coding, Ziv-Lempbel, Variable Length Coding and Arithmetic Coding can be found in Ian H. Witten, et al., "Managing Gigabits," Van Nostrand Reinhold, New York, 1994.

Further, in certain situations, it is often desirable to compress data that has already been compressed before transmission through a communication channel since alternative solutions (such as the addition of more channels with which to process the added information) are expensive.

Such problems are typically resolved through a coding technique that is based on internal characteristics of the data to be encoded. The data compression methods described above are based solely on structural characteristics (i.e, space characteristics) of data. Specifically, such methods do not systematically use other physical parameters to compress the data for transmission through a communication channel. The purpose of the present invention is to systematically exploit other physical parameters, i.e. time, to encode the structural characteristics of the data to be transmitted over a communication channel.

There are conventional methods that utilize time coding for transmitting data over a communication channel, but such methods do not involve increasing the transmission capacity through data compression. For example, Time Multiplexing is a method that allows the sharing of a transmission medium by establishing a sequence of time slots during which individual sources can transmit signals, whereby the entire bandwidth of the transmission medium is periodically available to each user for a restricted time interval. Time Multiplexing allows, for example, several persons to speak on a telephone through the same communication channel. Although the method of Time Multiplexing utilizes time characteristics for transmitting data over a communication channel, such method, however, does not employ data compression to increase the capacity of data which can be transmitted over the communication channel per unit time (i.e., data is not processed faster via time multiplexing).

Another well-known conventional method utilizing time encoding is Morse Code. Specifically, Morse Code is transmitted by sending pulses of current which generate points and dashes (representing letters) with prolonged time delays after each letter in a string in order to separate the letters. Such time coding (i.e., time delay) only serves to represent a symbol or a letter, and does not provide for data compression. Actually, it leads to an increase in the processing time of textual data since it requires too many time delays (i.e., a delay after each letter of a word).

SUMMARY OF THE INVENTION

It is an object of the present invention to provide system and methods for data compression in a communication channel using time encoding wherein the time at which a data unit arrives and/or the time interval between the arrival of data at a receiving end of a communication is varied to encode information.

It is another object of the present invention to provide system and methods for data compression utilizing time encoding in a communication system having communication channels that continuously vary in length.

The underlying principle of data compression using time encoding is that data can be encoded in such a manner that, upon receiving the encoded data at the receiving end of a communication channel, the data content can be retrieved by decoding (decompressing) the compressed data in accordance with the time delays in which data arrives at the receiving end. The present invention employs a method of time encoding for data compression wherein a series of data blocks (e.g., a string of binary data) which are comprised of data units (e.g., bytes or bits) are encoded with certain time characteristics and then distributed and transmitted over a communication channel. For example, the data blocks may be encoded in such a manner that the following information can be retrieved (i.e., decompressed or decoded) at the receiving end of the communication channel: (1) the content of each data unit can be read (e.g. a string of one byte that represents a character or two bytes which represents a short integer); (2) the time at which each data unit arrives can be measured (e.g., n-th unit arrives at n-th times $\frac{1}{100}$ second intervals); and (3) the time interval between each unit at the receiving end can be measured (e.g., the interval between consequent bytes is $\frac{1}{10000}$ second). By encoding such time characteristics in the data units of the data blocks, a substantial amount of information may be assigned to each data block, thereby providing data compression and a decrease in the transmission time of such data.

The time encoding method of the present invention preferably utilizes a method of transmitting data blocks with small variations of time for each data unit, which time can then be measured at the receiving end of the communication channel. For example, assume that a certain data unit is encoded according to the time at which each data unit arrives at the receiving end of a communication channel. Assume further that the n-th data unit arrives at an n-th times ($\frac{1}{100}$+d) where d represents values of time variation (i.e., delays in the arrival of data blocks). For purposes of illustration, assume that each data unit represents some signal (e.g. impulses of current), the data units having equal duration. Such data units will arrive at the receiving end of a communication channel at regular intervals (e.g. $\frac{1}{100}$ second) plus some delay (denoted by d). Assume further that a value of the delay d is chosen to be 0.0001 or 0.0002 seconds. In the case where d is measured to be 0.0001 sec., this could represent that the data unit consists of one byte of data, and the content of this one byte should be read. Further, in the case where d is measured to be 0.0002 sec., this could represent that the data unit consists of two bytes of data and the content of these two bytes would be read. It is to be understood that the value of the delay d can be chosen for different implementations of communication channels.

It is to be understood from the above example that a space overhead would result if such information (the variable length of the data units) was encoded based on an internal structure of the data units (e.g. first bit is zero or one). Therefore, by utilizing time encoding for data compression, the present invention can efficiently eliminate such overhead. By specifying time variations with more precision, one can represent more information about the internal data structure and achieve more data compression. It is to be appreciated by one of ordinary skill in the art that time intervals between blocks of transmitted data may be varied in accordance with the present invention to encode a variety of information.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

Figure 1:
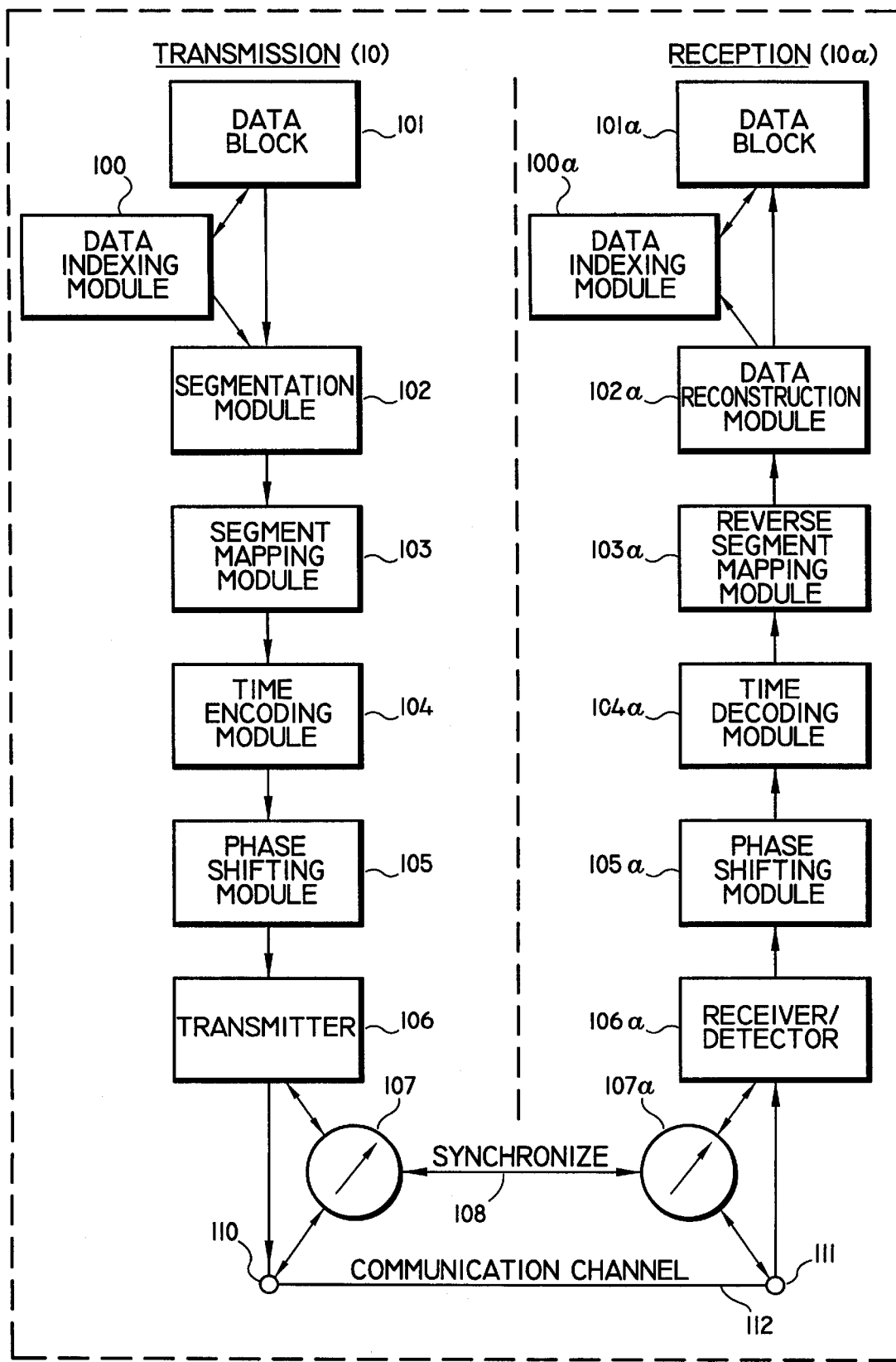
FIG. 1 is a flow/block diagram illustrating a method/system for data compression utilizing time encoding according to an embodiment of the present invention.

Referring now to FIG. 1, a flow/block diagram illustrating a method/system for data compression utilizing time encoding according to an embodiment of the present invention is shown. It is to be understood that the functional modules described herein in accordance with the invention may be implemented in hardware, software, or a combination thereof. Preferably, the time encoding features of the present invention are implemented in software in the form of functional software modules on an appropriately programmed general purpose digital computer or computers. It is to be further understood that, because such time encoding features of the present invention described herein are preferably implemented as software modules, the actual connections shown in the figures may differ depending upon the manner in which the invention is programmed. The transmitting and receiving features of the present invention in FIG. 1, such as the transmitter 106, may be implemented in hardware.

Referring to FIG. 1, a system 1 for providing data compression of a data block 101 according to an embodiment of the present invention comprises a transmission portion 10 for compressing the data block 101, and a receiving portion 10a for decompressing the compressed data, whereby the compressed data is transmitted from the transmission portion 10 of the system 1 to the receiving portion 10a of the system 1 through a communication channel 112, the communication channel 112 having an input end 110 and a receiving end 111. The transmission portion 10 of the system 1 comprises a segmentation module 102 for segmenting the data block 101 into uniform units of data. A data indexing module 100, operatively coupled to the segmentation module 102, stores information relating to the operation preformed by the segmentation module 102 (e.g., the number of bits comprising each data unit). A segment mapping module 103, operatively coupled to the segmentation module 102, maps each segment into a class. A time encoding module 104, operatively coupled to the segment mapping module 103, is provided for generating a departure schedule for each segment. A phase shifting module 105, operatively coupled to the time encoding module 104, is provided for delaying the transmission of data units. A transmitter, operatively coupled to the phase shifting module 105, is provided for transmitting the data units through the communication channel 112 to the receiving portion 10a of the system 1.

The receiving portion 10a of the system 1 comprises a receiver/detector 106a, connected to the receiving end 111 of the communication channel 112, for receiving the transmitted data units and measuring the arrival time of such units. A second phase shifting module 105a, operatively coupled to the receiver/detector 106a, is provided for performing a reverse time shifting operation of the phase shifting module 105. A time decoding module 104a, operatively coupled to the phase shifting module 105a, performs the inverse operation of the time encoding module 104. A reverse segment mapping module 103a, operatively coupled to the time decoding module 104a, performs the reverse operation of the segment mapping module 103. A data reconstruction module 102a, operatively coupled to the reverse segment mapping module 102a, is provided for reconstructing the data 101a. A second data indexing module 100a, operatively coupled to the data reconstruction module 102a, stores information needed by the data reconstruction module 102a to reconstruct the data 101a. Synchronization clocks 107 and 107a are operatively coupled to each other through a synchronize link 108 and the communication channel 112 so as to provide time synchronization between the transmission portion 10 and the receiving portion 10a of the system 1.

Figure 2:
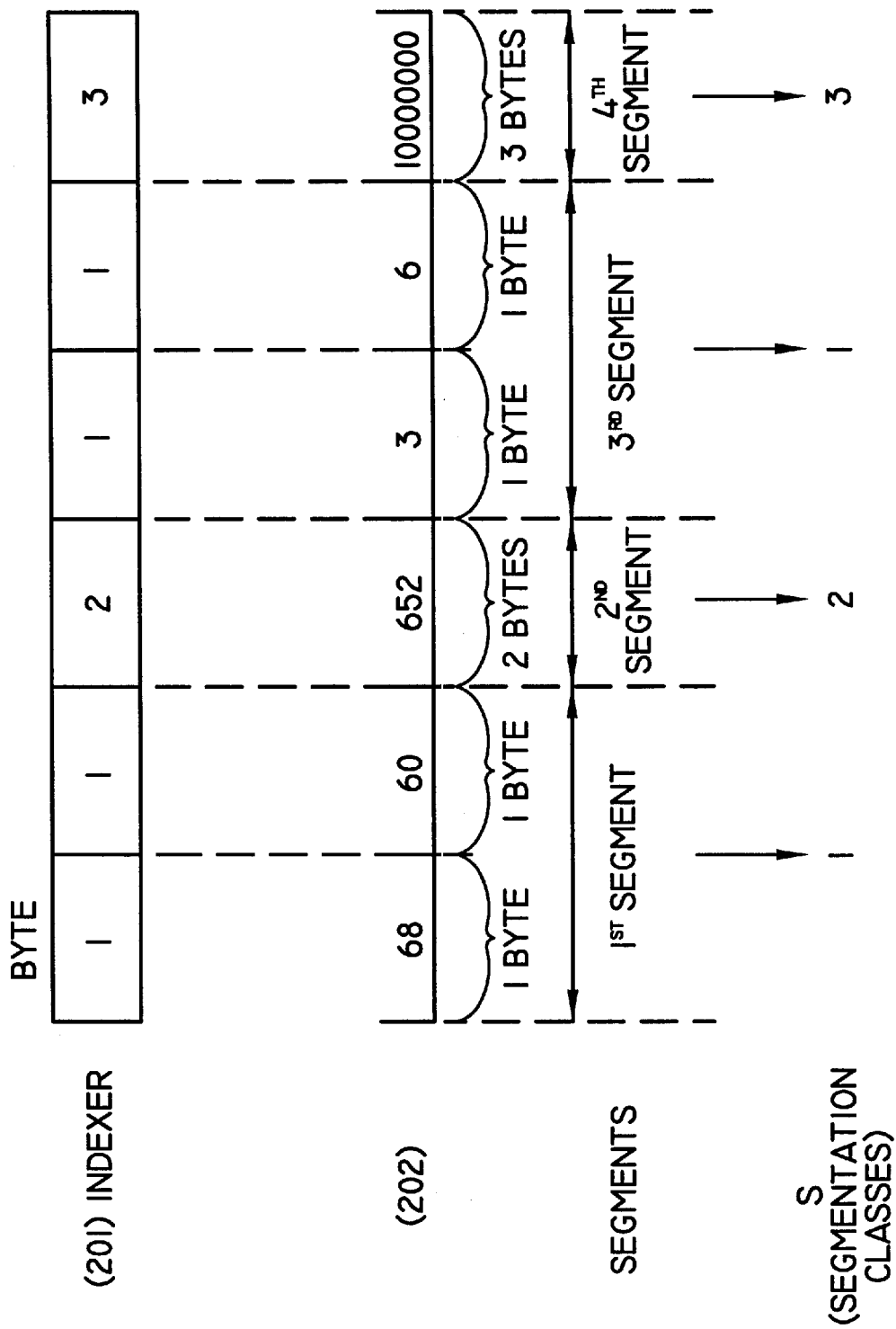
FIG. 2 is a diagram illustrating a method of encoding blocks of data comprising bytes according to an embodiment of the present invention.

Referring to FIGS. 1 and 2, a method for data compression utilizing time encoding according to the present invention is now described. It is assumed that the data block 101 is comprised of a sorted set of units (e.g., strings of binary bits). Each individual unit of the data block 101 has a certain duration which is equal to the sum of duration of each bit from which the individual units of the data block 101 are composed. (An example of physical characteristics of a data unit is given in FIG. 6). The unit duration is directly proportional to a time dU which is required for a single unit to completely pass through the a departing point (i.e., the input end 110 of the communication channel 112).

For illustrative purposes only, the duration of any set of data (e.g., unit, bit, several bits or units) will be defined as the time needed for such set of data to pass through a departing point in the communication channel (i.e., the input end 110 of the communication channel 112). The data is sent from the transmitter 106 to the receiver/detector 106a via the communication channel 112. It will be assumed in the following description that the communication channel 112 has a fixed length L and a fixed time constant K (e.g, in mcs) which is equal to the time that is required for the data to be transmitted from the input end 110 to the receiving end 111 of the communication channel 112.

Referring to FIG. 1, the data block (101) is segmented into uniform blocks of bits by segmentation module 102. A uniform set of consequent units means that each unit in a segment contains the same number of bits. Information pertaining to the number of bits comprising each data unit is preferably stored in the data indexing module 100. Alternatively, such information may be stored in the same unit (e.g. the first and/or second bit in each unit). For illustrative purposes, it will be assumed that the information relating to the number of bits comprising the current unit is stored in the data indexing module 100.

It is to be appreciated by one of ordinary skill in the art that other physical characteristics may be used as a measure of the duration of units (as opposed to bits in the present example). In such situation, consequent units that have the same duration represent a uniform set. For illustrative purposes only, the following description assumes that duration of units is measured in number of bits.

Referring to FIG. 2, a method of encoding blocks of byte data according to the present invention is shown. Assume that a string of numbers that are stored in 202, i.e., 68, 60, 652, 3, 4, 10,000,000. It is further assumed that each unit is represented as a byte (a unit of 8 bits). The 1st and 2nd numbers, 68 and 60, respectively, can each be written in a one byte block (i.e., one unit), the 3rd number, 652, can be written in a two byte block (i.e., two units), the 4th and 5th numbers, 3 and 4, respectively, can be written in a one byte block (i.e., one unit) and the 6th number 10,000,000 can be written in a three byte block (i.e., three units). Consequently, 9 bytes of memory would be needed to store the above numbers (i.e., 1+1+2+1+1+3)

Next, information relating to the number of bytes representing each unit is stored in an index area 201 (e.g., the data indexing module 100). Symbolically, such stored information is represented as a string 1, 1, 2, 1, 1, 3 in the index area 201. For illustrative purposes only, it is assumed that each number stored in the index area 201 requires one byte. Therefore, in order to store the string of numbers 68, 60, 652, 3, 4, 10000000 in this example, fifteen (15) bytes is required (i.e., six bytes for the index area and 9 bytes for numbers). In the present example, the index data constitutes 40% of the whole storage for the data (i.e. number of bytes for index storage (6) divided by the number of bytes needed to store the indexes and numbers (15) times 100).

Referring to FIG. 2, this data may then be segmented into 4 uniform blocks as follows:

1st segment: 68, 60—1

2nd segment: 652—2

3rd segment: 3, 4—1

4th segment: 10000000—3 wherein the number following the separator "—" shows a minimal number of bytes that are required to write numbers in a corresponding segment (hereinafter referred to as "segment classes").

The segment mapping module 103 then maps each segment S into its corresponding class. By way of example using the above numbered segments (i.e., 1st–4th segment), a segmented mapping may be defined as follows: S(1)=1, S(2)=2, S(3)=1, S(4)=3. Next, a class value C is used to denote a number of bytes pertaining to each class. It is to be understood by one of ordinary skill in the art that other examples can be constructed wherein each class is some measure of duration of units in a segment.

Next, in the time encoding module 104, a schedule is generated for the departure time of the segments (i.e., transmission) as follows. A time encoding function T is used to map the class values C (generated by the segment mapping module 103) into numbers dT. These dT values are defined as follows:

(1) Different class values are mapped into different numbers dT; and (2) Each dT is less than half of a duration of one bit (dB).

Referring to the example of FIG. 2, the following conditions are assumed: the duration of one bit dB is 0.001; and the maximum value of S(i) does not exceed 4 (i.e., 4 bytes). In this case an encoding function may be defined as follows:

T(1)=0.0000

T(2)=0.0001

T(3)=0.0002

T(4)=0.0003

In the example of FIG. 2, although a unit with 4 blocks was not illustrated, it is to be appreciated by one of ordinary skill in the art that a data can have such a unit.

This encoding function is then utilized by the phase shifting module 105 wherein a departure time of a unit n from a departing point (i.e., the input end 110 of the communication channel 112) is shifted on value T(C) where a class value is defined as C=S(n). The time for sending each unit from the departing point (i.e., the input end 110) is computed as follows. There exists an ideal scheme for scheduling the departing time of data that consist solely of units of minimal duration (e.g., one byte). In the current example, the 1st unit would depart at time O, the 2nd unit would depart at after a period of time dU (e.g., in dU mcscs), the 3rd unit would depart after a period of time of 2 dU, and each n-th unit would depart after a period of time denoted by (n−1) dU, where n=0, 1, 2, 3.

For illustrative purposes only, it is assumed that the this ideal time scheduling table is denoted as the function IT (i)=i−1. Consequently, in the situation where actual data is being transmitted, the departing time for a unit (i.e., time shift) is computed as follows. The 1st unit is transmitted at a moment of time denoted by sc(1)=IT(0)+S(C(1)), the 2d unit is transmitted at a moment of time denoted by sc(2)= IT(1)+S(C(2))+S(C(1)), and the n-th unit is transmitted at a moment of time denoted by sc(n)=IT(n)+S(C(n))+S(C(n−1))+. . . +S(C(1)).

The delayed transmission of the units is performed by the phase shifter 105, wherein the units are shifted to the left (i.e., in such a way as to delay their arrival at the receiving end 111 of the communication channel 112). In the present example, it is assumed that only data (without index data) is transmitted. Since the time shift sc(n) is much less than ndU, it takes less time to transmit the data via such shifting scheme as compared to the idealized scheme which sends all data, including index data, as a set of one-byte units.

This data will arrive at the receiving end 111 of the communication channel 112 (i.e., the destination point) via the communication channel 112 in a time of K mcs. More particularly, if the front of a unit departs from the transmitter 106 (i.e., from the input end 110 in FIG. 1.) at a time t0, then this front of the unit will be detected at a receiver/detector 106a at point 111 at a time t0+K. In accordance with the scheduling table discussed above, the first unit in the data stream will depart at time t0=sc(1) and then be detected by the receiver/detector 106a at a time sc(1)+K, the front of the second unit will depart at a time sc(2) and arrive at sc(2)+K. Similarly, the front of the n-th unit will depart at a time sc(n) and then be detected at the receiver/detector 106a after at a time sc(n)+K.

Figure 6:
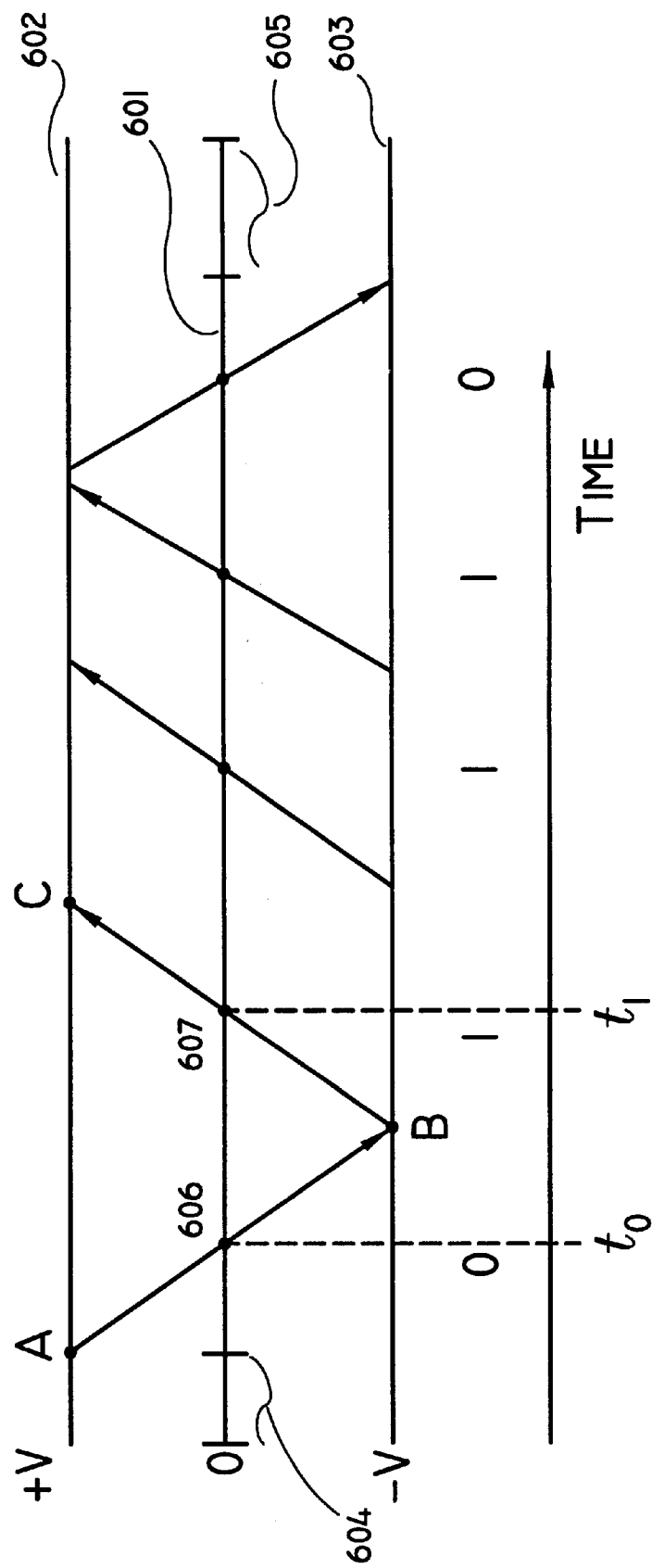
FIG. 6 is a diagram illustrating an example of physical characteristics of a data unit according to the present invention.

Different consequent units will arrive at the receiver/detector 106a at different time intervals. Such units are distinguished from one another by special signal representation between them which is detected by the receiver/detector 106a. Referring to FIG. 6., physical attributes of a data unit (i.e., a sequence of 01110 bits) is shown. The line 601 denotes a zero volt line. The line 602 denotes a level of voltage (e.g., +V) and line 603 denotes a level of voltage (e.g., −V). Subunits (i.e. the bits) are represented by a declining amplitude (AB) or an increasing amplitude (BC) in time. The declining lines (e.g., AB) can represent 0 bits and the increasing lines (e.g., BC) can represent 1 bits. Crossing zero lines can be used to indicate a time of arrival for a given representation of a bit. Other physical representation of waveforms are possible. See, for example J. Bellany, "Digital Telephony." John Wiley & Sons, Inc., New York, 1991, section 4.1 (Pulse Transmission). In addition, the reference Kamilio Feher, "Advanced Digital Communication," Prentice-Hall, 1987, describes how different waveforms may be implemented to represent units.

The receiver/detector module 106a interprets the data units as follows. For example, assume that a signal carries a string of bits (n-th unit) and is represented as in FIG. 6 with decreasing/increasing voltages (−V and V). Delay segments 604 and 605 are detected by the receiver/detector module 106a to separate consequent data units. Specifically, if the receiver/detector module 106a detects a zero volt line segment (i.e., delay segment 605) after this n-th unit, it would mark this part of the transmitted signal with a special mark as a separator between units when it subsequently sends data to the phase shifting module 105a. The duration of the zero volt line segment (i.e., delay segment 604) equals the difference between the time of arrival of the n-th unit and a next n-th+1 unit (i.e., sc(n+1)−sc(n) where sc(n) is defined above). Each data that is separated by a separator is a segment that contains a uniform set of consequent units.

The receiver/detector module 106a also interprets the waveform of FIG. 6 as a string 01110 bits by detecting the changes in amplitude. Further, the receiver/detector module 106a detects the time of arrival of each bit by detecting zero-cross points 606 and 607. For example, bit 0 (AB) is detected to arrive at time t0 which corresponds to the time when AB crosses the zero-volt line 601 at point 606 and bit 1 (BC) is detected to arrive at a time t1 which corresponds to the time when BC crosses the zero-volt line 601 at point 607. A detailed description of a zero-crossing detection, as preferably utilized by the present invention, can be found in J. A. C. Bingham, "Theory and Practice of Modem Design," section 7.4.2, John Wiley & Sons, New York, 1988.

Referring to FIG. 1, the received units are then sent from the receiver/detector module 106a to the phase shifting module 105a, which is similar in function to the phase shifting module 105, but the units are time shifted in opposite direction. Specifically, the phase shifter 105(a) time shifts the units to the right, i.e, a 1st unit by sc(1), 2nd unit by sc(2) and n-th unit by sc(n). Next, the time decoding module 104a performs a reverse time encoding function. The time decoder module 104a restores the duration of n-th units from sc(n) using the inverse of the encoding map T of the time encoder module 104 (i.e., in above example, 0.0000 is mapped into 1, 0.0001 is mapped into 2, etc.) The reverse segment mapping module 103a then performs the reverse operation of the segment mapping module 103. For example, if a k-th unit was marked by the inverse time function T as 2, a segment S(k) would consist of a consequent set of 2-byte integers. Therefore, in the above example, segment classes will be mapped into segments as follows:

1 into S(1);
2 into S(2);
1 into S(3); and
3 into S(4).

The data reconstruction module 102a then performs the inverse operation of the segmentation module 102 to reconstruct the data block 101a and the data index 100a as it existed prior to transmission. Segments of data S(1), S(2), . . . are places in a data block 101a consequently at some storage. Information pertaining to each segment S(i) is stored in the data indexing module 100a. Such information consists of what kind of data is stored in S(i) (e.g. what is the length of integers in S(i)—one or two bytes) and an address of where such segment is stored in memory of data indexing module 101a.

As demonstrated above, the time saved during transmission utilizing such a coding scheme is proportional to the difference between sc(n) and n. The time n is proportional to the time that would have been required to transmit the information in the data indexing module 100. Specifically, n represents n bytes in the data indexing module 100 (where each byte contains the information relating to the units as described above). If the index data is transmitted, a certain amount of time n is required to send n bytes. In the above example, however, it was assumed that data in the data indexing module 100 was not transmitted. Rather, the information was encoded by the delay (i.e., the delays for n units being equal to s(n)). Such delays are only a fraction of the time n. Accordingly, the time saved is proportional to ns(n).

In the above example, it was assumed that the index area was available from a data storage, i.e, the data indexing module 100. It is to be appreciated that it is possible to process the data block 101 without the given index area. Rather than provide a given index area for the data block 101, it can be assumed that all integers occupy the same number of bytes. For example, each integer could be stored as a 4 byte integer. In the above example six integers (68, 60, 652, 3, 4, and 10, 000, 000) were considered. Such integers could be stored in the data block 101 in different ways: each integer would occupy a sub-block if 4 bytes without any index area. In this case, the index area of the data indexing module 101 can be dynamically produced prior to the segmentation process of segmentation module 102 It is simple to compute "on the run" (i.e., in real time) a minimal number of bytes that are needed to store each integer. For example, it can be immediately determined that 68 and 69 can be stored in a 2-byte block, 652 in a 3-byte block and so on. This can be determined by a table that contains precomputed information relating to the number of bytes needed for integers of certain sizes. After such index area is dynamically created, the time encoding process can continue from the segmentation process (block 102) as described above. At the receiving portion 10a of the system 1, the index area of data indexing module 100a can remain as described above.

It is to understood that in the method of FIG. 1, it is essential that the communication channel 112 has a fixed length L and the fixed time K for transmitting the data between the input end 110 and the receiving end 111 of the communication channel 112. In practice, however, the distances between the input end 110 and the receiving end 111 of the communication channel 112 is very large. As a result, it is difficult to keep the parameters L and K fixed for a substantial period of time since a variety of factors can effect these parameters. Moreover, such factors can effect the quality of the signal such as signal attenuation or channel distortion when a signal is transmitted over a communication channel. These problems are discussed in J. A. C. Bingham, "Theory and Practice of Modem Design," John Wiley & Sons, New York, 1988).

To resolve such problems, the length of the communication channel (L) should therefore be chosen such that the signal will not be distorted beyond a point where its content cannot be recovered when received at the end of the channel. Any conventional method for reconstructing a sequence of transmitted data bits may be used to recover signals that have been distorted, such as the method described in J. Bellany, "Digital Telephony," John Wiley & Sons, Inc. New York, 1991 (see FIG. 4.4, page 170). If a distance to a point where data should be transmitted is greater than the length L where data cannot be recovered, intermediate time encoding switching devices should be utilized. This is performed by partitioning the entire communication channel 112 into several sections, wherein each section of the communication channel is less than a length L so as to ensure that the transmitted data can be recovered.

Figure 3:
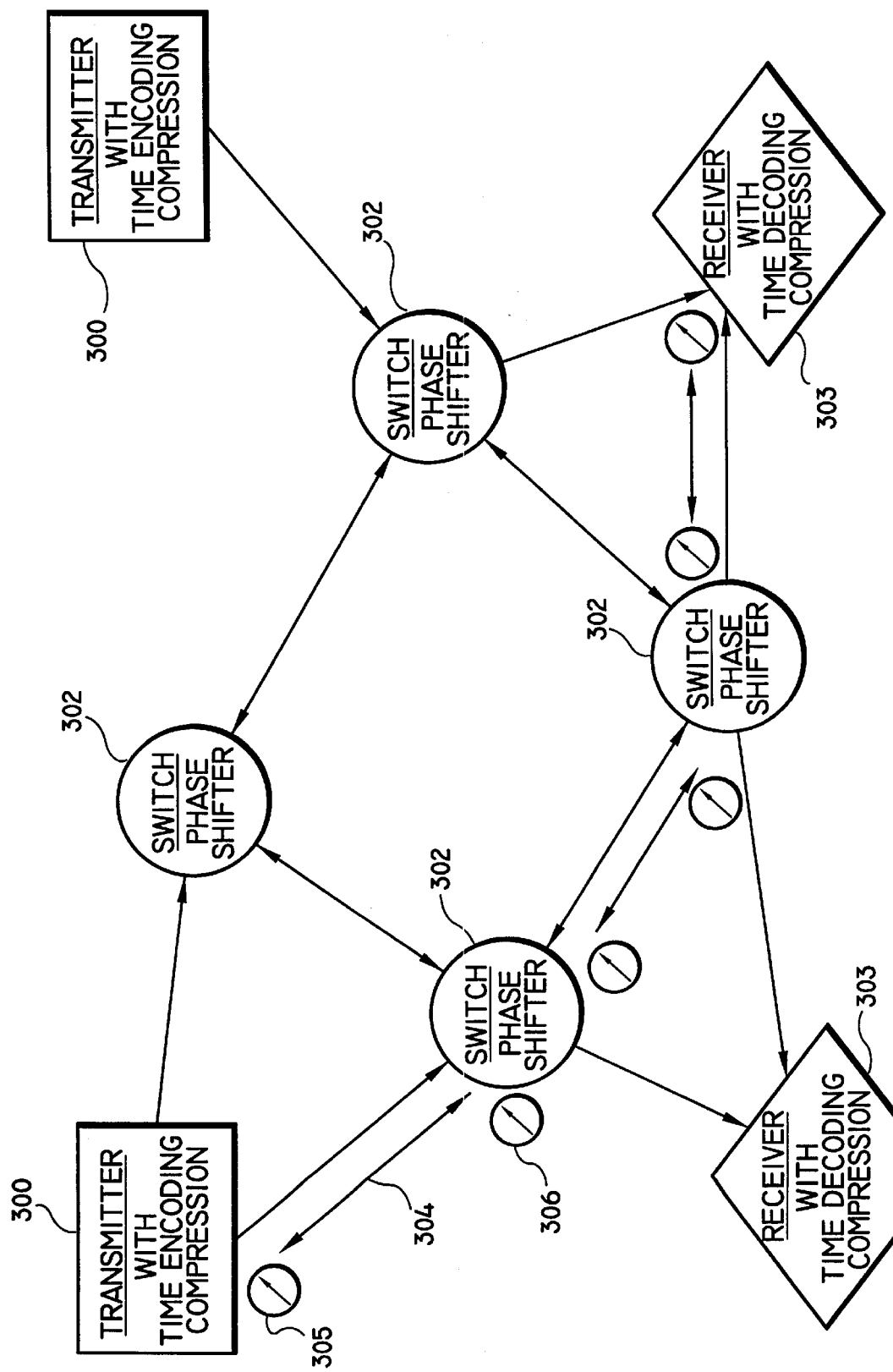
FIG. 3 is a block diagram illustrating a communication network utilizing the time encoding data compression method according to an embodiment the present invention.

Referring now to FIG. 3., a communication network with time encoding switches for utilizing the method of the present invention is shown. Data is sent from transmitters 300 to receivers 301 via switches 302. A similar communication network is disclosed in Gill Waters, "Computer Communication Networks", McGraw-Hill, 1991, p. 4. However, the switches in the above reference do not utilize the time encoding/decoding compression/decompression mechanisms as described in FIG. 1. It is to be appreciated that the standard communication network described in the above reference can be enhanced by implementing each switch 302 with a phase shifter that adapts the time encoding scheme to a new routine to the next switch or to a receiver. For example, at each of these intermediate points, a signal could be restored from a distorted form and then further transmitted with an updated scheduling table. Specifically, the switches can contain the receiver/detector module 106a and the phase shifting module 105a to restore a transmitted waveform into its original form. After restoration of the signal at each intermediate receiving switching point 302, a procedure may be performed via the receiver/detector module 106a and phase shifting module 105a wherein such data could be further transmitted along the communication channel with a scheduling table (sc(n) as described above) and a new parameter K which is added to sc(n) (as explained above) for the next communication path (i.e, to another switch 302 or to a receiver 303). The new scheduling table sc(n) and the new variables K1 allows each switch 302 or receiver 303 process data that is transmitted over the plurality of communication channels in FIG. 3 so as to support the quality of the signals at each switching step.

Furthermore, referring to FIGS. 1 and 3, in order to keep the parameters L and K updated, synchronized signals between a transmission clock 107 and a receiving clock 107a via link 108 (or between clocks 305 and 306 along a synchronization link 304) should be periodically transmitted in order to update the variables L and K. Impulses can be sent from clock 107 to clock 107a and then back from clock 107a to clock 107 periodically (following some predetermined plan). This allows the K parameter to be adjusted. For example, if the transmission time from clock 107 to clock 107a and back to clock 107 (and similarly for clocks 305 and 306) is equal to 2K+2t, then K should be increased by the time t in the phase shifting module 106a.

Such a method can also be used to synchronize the clocks 107 and 107a. In FIG. 1, such signals may be sent over communication line 108 or the communication channel 112. For example, a signal can be sent from clock 107 containing information about the time of clock 107, as well as the transmission time, to clock 107a sd that clock 107a can adjust its time accordingly (this assumes that conditions at a communication channel are relatively stable and do not change while a communication between clocks 107 and 107a is occurring.) The frequency with which the L and K parameters should be updated may depend on a concrete implementation of the transmission line and the degree to which such parameters vary.

The time encoding data compression method of the present invention can be used for any type of communication channels in network such as with analog/digital lines, fiber optic lines, wireless lines, and radio lines. It can also be extended to communication between satellites, where the distance between transmitters and receivers continuously varies. Therefore the time encoding function and phase shifters should be not static but dynamically adapted to sputniks movements.

Referring to FIG. 3, dynamic phase shifting is used if the distance between the switches is not fixed but changes with time (e.g., due to satellite motion). With regard to a satellite communication system, it is assumed that the transmitter 300 of FIG. 3 is located at a ground base station and the time encoding switches 302 are on the satellites. As explained above, a synchronization signal can be sent from clock 305 at the transmitter 300 to a clock 306 on the satellite and then from clock 306 to clock 305 so as to periodically adjust the K parameter which is used by the receiver/detector module 106a in the switches 302 and receivers 303. Such impulses must continuously be transmitted due to the constant motion of the satellite which causes the parameter K to frequently change. Moreover, a model of the movement of the satellite in its orbit may be utilized to estimate or calculate the value of K impulse. This is possible since satellites are moving in stable orbits and their position at any time t can be calculated. As a result, a parameter K(t) becomes a function of time that depends on the known movement of the satellite. This function K(t) may then be used to generate the scheduling table as explained above.

Figure 4:
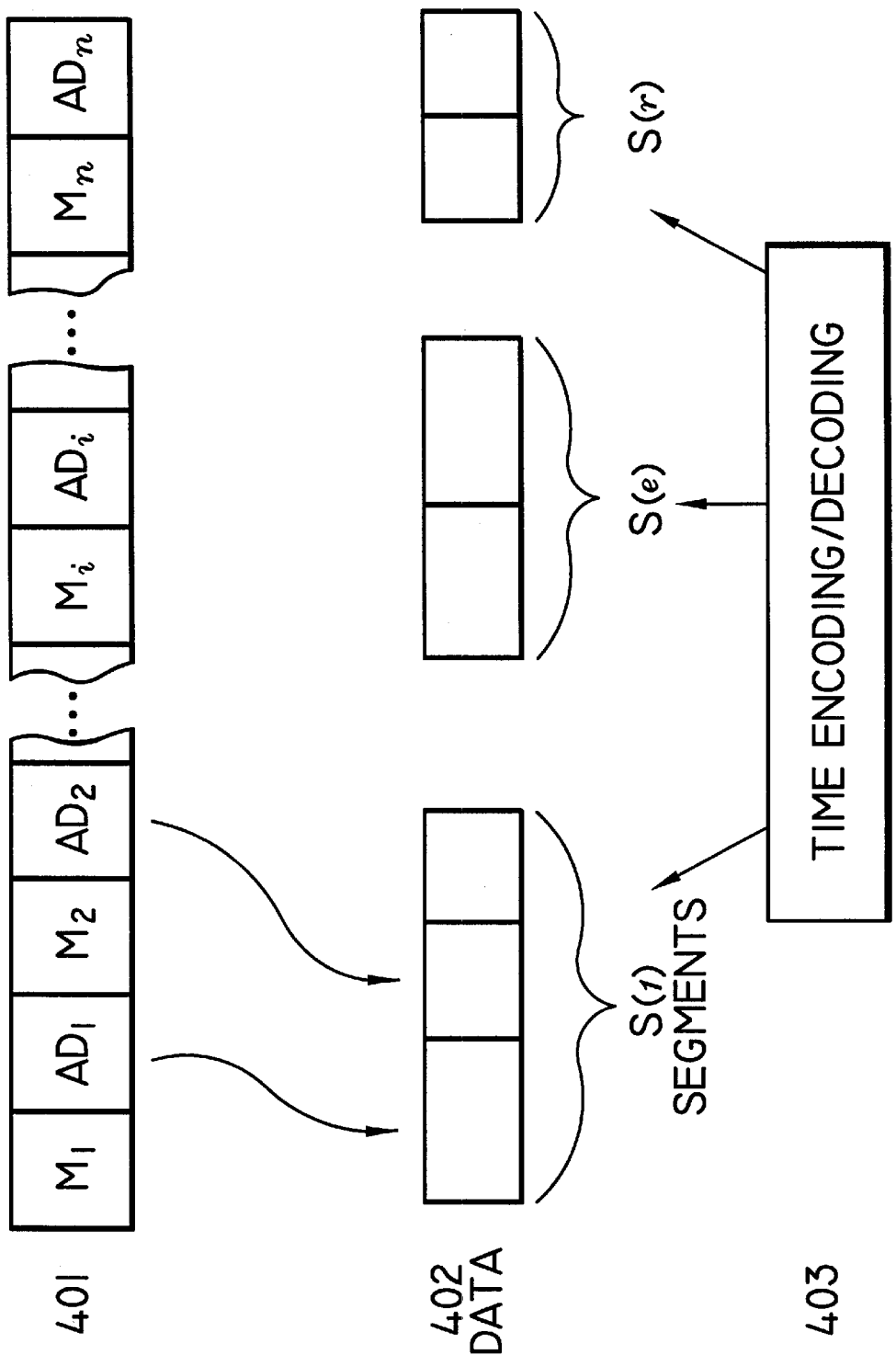
FIG. 4 is a diagram illustrating the function of the segment mapping module and the inverse mapping module of FIG. 1 according to the present invention.

Referring to FIG. 4, a diagram illustrating the process for segmentation mapping and inverse segmentation mapping (blocks 103 and 103a in FIG. 1) is shown. A block 401 denotes an index area in the data indexing modules 100 and 100a (FIG. 1) for a segmented data block 402. The block 401 consists of the length of the k-th unit in 402 (Mk) and an address (Adk) which indicates where the unit is located in block 402. In the example set forth above, addresses were not referred to with respect to the data indexing modules for purposes of simplicity. However, such addressing is generally needed for storing and retrieving such data (see Ian H. Witten, Alistair Moffat, Timothy C. Bell "Managing Gigabits" Van Nostrand Reinhold, New York, 1994 p. 72). During the segmentation process, segments S1, S2 . . . S(n) are created from consequent set of units that have the same length (i.e. the same corresponding numbers Mi in the index area 401).

On the other hand, an inverse segmentation map is constructed from information pertaining to the time delays of the data that is obtained from the time coding module 403. As demonstrated above, the size of the phase shift is directly proportional to the length of the first unit in the segment. When a unit with a different size arrives (i.e, having a different phase shift), it is determined that a new segment is started with units having a length that is uniquely defined from a new phase shift.

Figure 5:
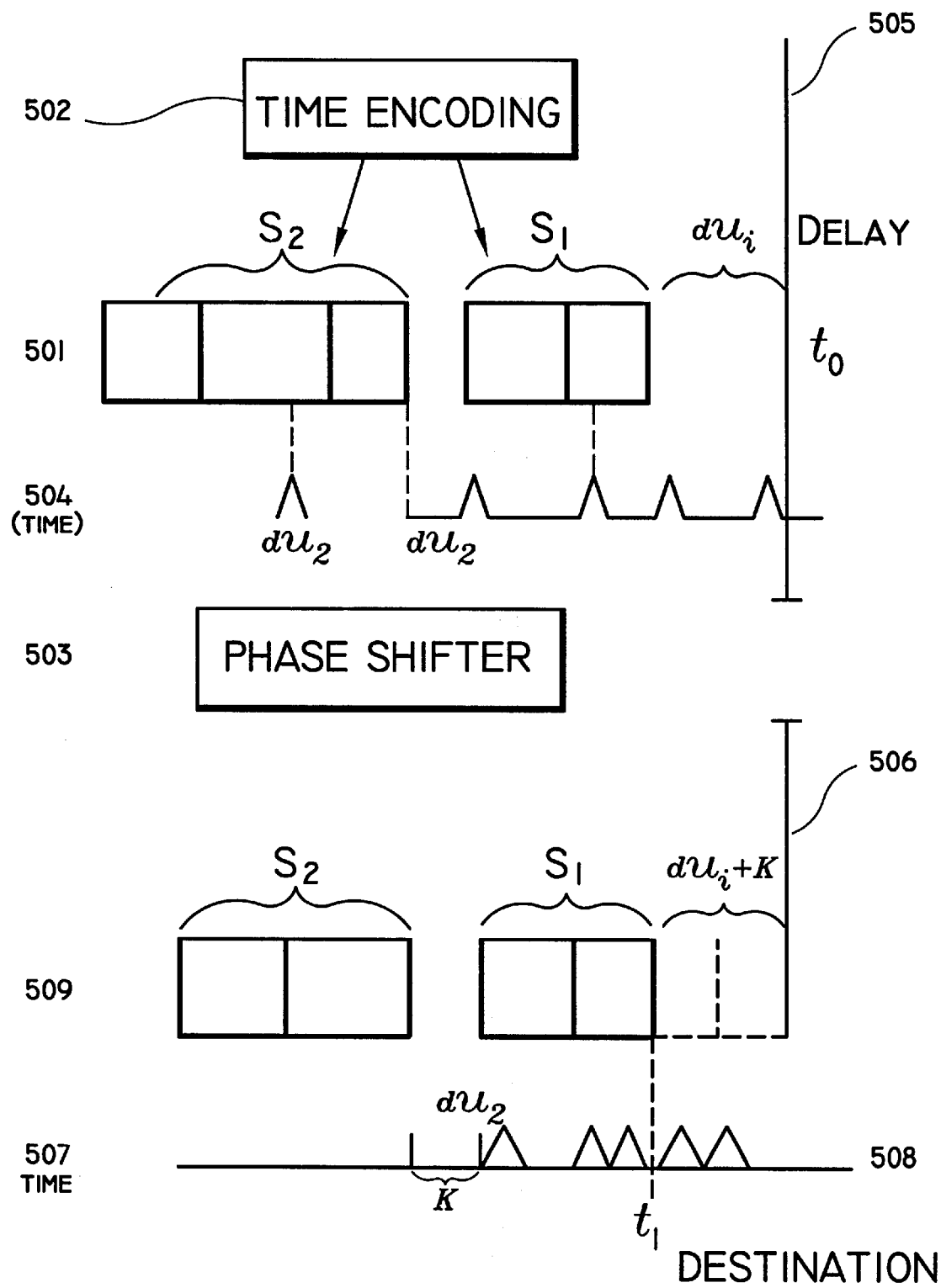
FIG. 5 is a diagram illustrating the relationship between the time encoding operation and time decoding operation of data segments according to the present invention.

Referring to FIG. 5, a detailed representation with regard to the relation between the segmentation process and time encoding/decoding process is provided. Reference numeral 501 denotes units that are packaged into segments (e.g., S1 consists of two short units and S2 consists of 3 long units). Reference numeral 504 denotes symbolically pulses of a time clock that are generated at equal intervals. A vertical line denoted by reference numeral 505 intersects the communication channel at a departing point (i.e, reference numeral 110 in FIG. 1). A time encoding block 502 has a unique value dU corresponding the size of the units in a segment S1 (block 501). This value dU is the basis for the time delay performed by a phase shifter 503. Specifically, phase shifter 503 delays the departure of units in segment S1 by the time dU1 from a departing line 505. The next segment S2 of block 501 consists of units of a different duration for which the time encoding block 502 provides a different delay time dU2. The phase shifter 503 will delay units in the segment S2 from the departing line 505 by a time of dU2.

At the point of destination (indicated by line 506), the first unit in the segment S1 (block 509) will arrive with a time delay equal to dU1 plus K (i.e, the time delay for commencing transmission plus the time for transmission over the communication channel 112 (FIG. 1). Time clocks 507 at the transmission and receiving ends of the communication channel are synchronized in such a way that after subtracting K from a time t1 (i.e., the time at which the front unit of S1 was detected at the receiving end 508), the value dU1 can be determined which translates into the size of units in S1. Changes in such a delay (next will be dU2) indicates the beginning of a new segment S2 and the size of units comprising such segment.

Although illustrative embodiments of the present invention have been described herein with reference to the accompanying drawings, it is to be understood that the invention is not limited to those precise embodiments, and that various other changes and modifications may be effected therein by one skilled in the art without departing from the true scope and spirit of the invention.

What is claimed is:

1. A system for time-encoding data for transmission on a communication channel, the system comprising:

a transmitting portion for generating time-encoded data, said transmitting portion comprising:

means for segmenting a block of data into data units to produce a plurality of segments each comprising at least one data unit;

means for generating a time schedule for a delayed transmission of each of said data units of each segment based on the information content of the data units of each segment;

means for mapping each segment of data units into a segment class and assigning a class value to each segment in accordance with a measure of a duration of the units of comprising each segment; and means for transmitting each data unit of each segment in accordance with the generated time schedule; and a receiving portion for receiving said transmitted data units, said receiving portion comprising;

means for determining an arrival time and a delay time for each received data unit;

means for inversely mapping the segment classes into the corresponding segments; and means for decoding information content of said data units based on said determined arrival time of said data units.

2. The system of claim 1 further comprising means for determining a time interval between each received data unit.

3. The system of claim 2 further comprising means for decoding information content of said received data units based on said time interval between said segments.

4. The system of claim 1, for comprising means for synchronizing, the transmission of said time-encoded data units from said transmitting portion on said communication channel with the arrival of time-encoded data units at said receiving portion of said system.

5. The system of claim 1 wherein said time, schedule generating means utilizes a time encoding function to map the segment class values to delay time values for the delayed transmission of the data units of the segments.

6. The system of claim 1, further comprising index means for storing segment and data unit information.

7. The system of claim 1, wherein the length of the communication channel is fixed.

8. The system of claim 1, wherein the length of the communication channel varies with time and the time schedule generating means is configured to dynamically consider a transmission time between the transmitting portion and the receiving portion for generating the data unit transmission times.

9. A system for compressing data with time encoding for transmission on a communication channel, the system comprising:

a transmitting portion for generating time encoded compressed data, said transmitting portion comprising:

means for storing blocks of data;

means for segmenting said blocks of data into units;

means for generating a time schedule for the transmission of said segments on said communication channel;

means for delaying a time of transmission of said segments on said communication channel based on said time schedule; and means for transmitting said delayed segments on said communication channel;

a receiving portion for processing said compressed data, connected to a receiving end of said transmission channel, said receiving portion comprising;

means for receiving said transmitted segments, said receiving means being connected to said communication channel;

means for determining an arrival time and a delay time for said transmitted delayed segments;

means for retrieving information based on said determined arrival time of said transmitted segments; and means for reconstructing said blocks of data from said segments, and means for synchronizing the transmission of said compressed data from said transmitting portion on said communication channel with the arrival of said compressed data at said receiving portion of said system, wherein said synchronization means comprises a first synchronization clock operatively coupled to said transmitting means of said transmitting portion and a second synchronization clock operatively coupled to said receiving portion, whereby signals from said first and said second synchronization clocks are transmitted over said communication channel to synchronize the time of said first and second synchronization clocks.

10. A method for time-encoding data for transmission on a communication channel, the method comprising the steps:

segmenting a block of data into data units;

generating a time schedule for a delayed transmission of each of said data units of each of said segments based on information content of the data units of each segment;

mapping each segment of data units into a segment class and assigning a class value to each segment in accordance with a measure of a duration of the units of comprising each segment;

transmitting each data unit of each segment in accordance with the generated time schedule on said communication channel;

receiving said transmitted data units;

inversely mapping the segment classes into the corresponding segments; and decoding information content of said received data units based on determined time of arrival of said data units.

11. The method of claim 10, wherein the step of decoding said information content is further based on a determined time interval between received data units.

12. The method of claim 10, further comprising the step of synchronizing the time of transmission of said data units on said communication channel with a time of arrival of said data units at an end of said communication channel to determine a time of transmission for data on said communication channel.

13. The method of claim 10, further comprising the step of transmitting synchronizing signals on the communication channel to synchronize the transmission of said time-encoded data units on said communication channel with the arrival of the time-encoded data units.

14. The method of claim 10 wherein the step of generating said time schedule comprises the step of utilizing a time encoding function to map the segment class values to delay time values for the delayed transmission of the data units of the segments.

* * * * *